United States Patent
Park et al.

(10) Patent No.: US 10,008,695 B2
(45) Date of Patent: Jun. 26, 2018

(54) ELASTOMER PATTERNS FOR A FLEXIBLE DISPLAY DEVICE

(71) Applicant: SAMSUNG DISPLAY CO., LTD., Yongin-si, Gyeonggi-do (KR)

(72) Inventors: Youngsang Park, Seoul (KR); Inseo Kee, Asan-si (KR); Jungho Park, Hwaseong-si (KR); Kyu-taek Lee, Cheonan-si (KR); Chulho Jeong, Hwaseong-si (KR); Hwal Choi, Busan (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days. days.

(21) Appl. No.: 15/230,360

(22) Filed: Aug. 5, 2016

(65) Prior Publication Data

US 2017/0155084 A1 Jun. 1, 2017

(30) Foreign Application Priority Data

Dec. 1, 2015 (KR) .................. 10-2015-0170161

(51) Int. Cl.
*H01L 29/08* (2006.01)
*H01L 21/00* (2006.01)
*H01L 51/52* (2006.01)
*H01L 51/00* (2006.01)
*G06F 1/16* (2006.01)
*H01L 27/32* (2006.01)

(52) U.S. Cl.
CPC ........ *H01L 51/5253* (2013.01); *G06F 1/1652* (2013.01); *H01L 51/0097* (2013.01); *H01L 51/5237* (2013.01); *H01L 51/5246* (2013.01); *H01L 27/323* (2013.01)

(58) Field of Classification Search
CPC ............. H01L 51/5253; H01L 51/0097; H01L 51/5246; H01L 51/5237
See application file for complete search history.

(56) References Cited

U.S. PATENT DOCUMENTS

| | | | | |
|---|---|---|---|---|
| 4,928,438 A | * | 5/1990 | Narimatsu | B24B 37/30 257/E21.214 |
| 2007/0257821 A1 | * | 11/2007 | Son | G06F 3/016 341/22 |
| 2008/0055831 A1 | * | 3/2008 | Satoh | G02F 1/133305 361/600 |
| 2011/0261300 A1 | * | 10/2011 | Miyazaki | G06F 3/042 349/104 |
| 2013/0083496 A1 | | 4/2013 | Franklin et al. | |

(Continued)

FOREIGN PATENT DOCUMENTS

| | | |
|---|---|---|
| JP | 2015-025064 A | 2/2015 |
| JP | 2015-030765 A | 2/2015 |

(Continued)

*Primary Examiner* — Alonzo Chambliss
(74) *Attorney, Agent, or Firm* — Lewis Roca Rothgerber Christie LLP

(57) ABSTRACT

A flexible display device includes a display module and a window member disposed on the display module. The window member includes a base film, elastomer patterns disposed on one surface of the base film, and a hard coating layer disposed on the one surface of the base film to cover the elastomer patterns.

20 Claims, 12 Drawing Sheets

(56) References Cited

U.S. PATENT DOCUMENTS

| | | | |
|---|---|---|---|
| 2013/0321344 A1* | 12/2013 | Ting | G06F 3/0421 |
| | | | 345/175 |
| 2014/0065326 A1 | 3/2014 | Lee et al. | |
| 2014/0255669 A1 | 9/2014 | Akou et al. | |
| 2016/0118616 A1* | 4/2016 | Hiroki | H01L 51/0097 |
| | | | 257/40 |
| 2017/0092892 A1* | 3/2017 | Zhang | H01L 51/5237 |

FOREIGN PATENT DOCUMENTS

| | | |
|---|---|---|
| KR | 10-1173918 | 8/2012 |
| KR | 10-2013-0106731 A | 9/2013 |
| KR | 10-2015-0035306 A | 4/2015 |

\* cited by examiner

ELASTOMER PATTERNS FOR A FLEXIBLE DISPLAY DEVICE

CROSS-REFERENCE TO RELATED APPLICATION

This U.S. non-provisional patent application claims priority to and the benefit of Korean Patent Application No. 10-2015-0170161, filed on Dec. 1, 2015, the entire contents of which are hereby incorporated by reference.

BACKGROUND

1. Field

The present disclosure relates to a flexible display device. For example, embodiments of the present disclosure relate to a flexible display device having a window member.

2. Description of the Related Art

Electronic devices, such as a smart phone, a digital camera, a notebook computer, a navigation system, a smart television set, etc., have been developed. The electronic devices include a display device to provide a user with information.

The display device has a shape that varies depending on variations in shape of the electronic devices. Electronic devices include a flat panel display device, but electronic devices, which are recently developed, are required to include a flexible display device, such as a curved type (e.g., curved kind), bending type (e.g., a bending kind), or rolling type (e.g., rolling kind) of display device.

In addition, consumers desire a slim and robust electronic device.

SUMMARY

Embodiments of the present disclosure provide a flexible display device capable of reducing defects thereof.

Embodiments of the present disclosure provide a flexible display device including a display module and a window member on the display module. The window member includes a base film, elastomer patterns on a surface of the base film, and a hard coating layer on the surface of the base film to cover the elastomer patterns.

Each of the elastomer patterns includes at least polyisoprene rubber, polybutadiene rubber, chloroprene rubber, butyl rubber, halogenated butyl rubber, styrene-butadiene rubber, nitrile rubber, halogenated nitrile rubber, ethylene propylene rubber, ethylene propylene diene rubber, epichlorohydrin rubber, polyacrylic rubber, silicone rubber, fluorosilicone rubber, fluoroelastomer, perfluoroelastomer, polyether block amides, chlorosulfonated polyethylene, or ethylene vinyl acetate.

The elastomer patterns each have a same (e.g., substantially the same) shape and include a same (e.g., substantially the same) material.

The elastomer patterns are spaced apart from each other at regular (e.g., substantially regular) intervals.

Each of the elastomer patterns has a height of about 20 micrometers to about 40 micrometers.

The hard coating layer has a thickness greater than the height of each of the elastomer patterns and the thickness of the hard coating layer is in a range from about 30 micrometers to about 50 micrometers.

The elastomer patterns are overlapped with about 20% to about 50% of an entire area of the surface of the base film.

Each of the elastomer patterns has an area of about 10 $\mu m^2$ to about 100 $\mu m^2$ on the one surface of the base film.

Each of the elastomer patterns has a pencil hardness of about 4B to about 5B and the hard coating layer has a pencil hardness of about 7H to about 9H.

Each of the elastomer patterns has an elastic modulus of about 50 MPa to about 100 MPa and the hard coating layer has an elastic modulus of about 5 GPa to about 7 GPa.

The display module includes a display area to display an image and a non-display area adjacent to the display area. The window member further includes a bezel pattern overlapped with an edge area (e.g., a periphery) of the base film corresponding to the non-display area.

The bezel pattern is on the surface of the base film and the hard coating layer covers the bezel pattern.

The display module includes a display panel to generate an image and a touch screen on the display panel to sense an external input.

The display panel includes a base substrate, a circuit layer on the base substrate, an organic light emitting element layer on the circuit layer, and a thin film encapsulation layer encapsulating the organic light emitting element layer.

The touch screen includes first and second touch electrodes insulated from each other while crossing each other, and at least one selected from the first and second touch electrodes is directly on the thin film encapsulating layer.

Embodiments of the present disclosure provide a flexible display device including a bending area and a flat area. The flexible display device includes a display module and a window member on the display module. The window member includes a base film, elastomer patterns at least in the bending area and on a surface of the base film, and a hard coating layer covering the elastomer patterns.

The window member further includes a bezel pattern overlapped with an edge area (e.g., a periphery) of the base film and on the surface of the base film.

According to the above, the elastomer patterns improve the flexibility of the window member, and thus the window member may be prevented from being cracked in the bending area (or an amount or likelihood of such cracking may be reduced). The hard coating layer may prevent the window member from being deformed (or an amount or likelihood of such deformation may be reduced) even though an external object makes contact with the window member. The window member may have flexibility and high surface hardness.

Since the bezel pattern is on the outer surface of the same base film as the elastomer patterns, the thickness of the adhesive member used to couple the display module to the inner surface of the base film may be reduced. Thus, the display device may be slim.

BRIEF DESCRIPTION OF THE DRAWINGS

The above and other features of the present disclosure will become readily apparent by reference to the following detailed description when considered in conjunction with the accompanying drawings wherein.

DETAILED DESCRIPTION

Figure 1A:
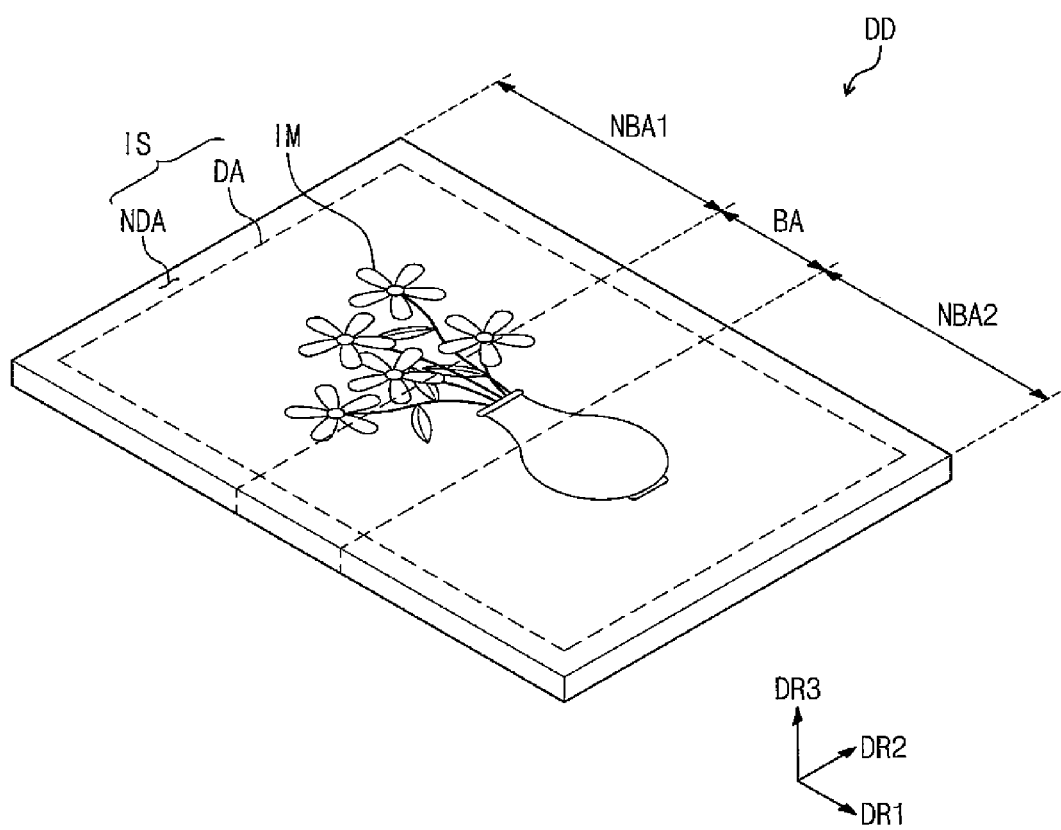
FIG. 1A is a perspective view showing a flexible display device in a first operation according to an exemplary embodiment of the present disclosure.

The following description with reference to the accompanying drawings is provided to assist in a comprehensive understanding of various embodiments of the present disclosure as defined by the claims and their equivalents. It includes various details to assist in that understanding but these details are to be regarded as merely exemplary. Accordingly, those of ordinary skill in the art will recognize that various changes and modifications of the various embodiments described herein can be made without departing from the scope and spirit of the present disclosure.

In the drawings, the thickness of layers, films, and regions are exaggerated for clarity. Like numbers refer to like elements throughout. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. In addition, even though a surface of any layer is shown to be flat, a step difference may occur on an upper layer in accordance with a surface shape of a lower layer.

Hereinafter, embodiments of the present disclosure will be explained in more detail with reference to the accompanying drawings.

Figure 1B:
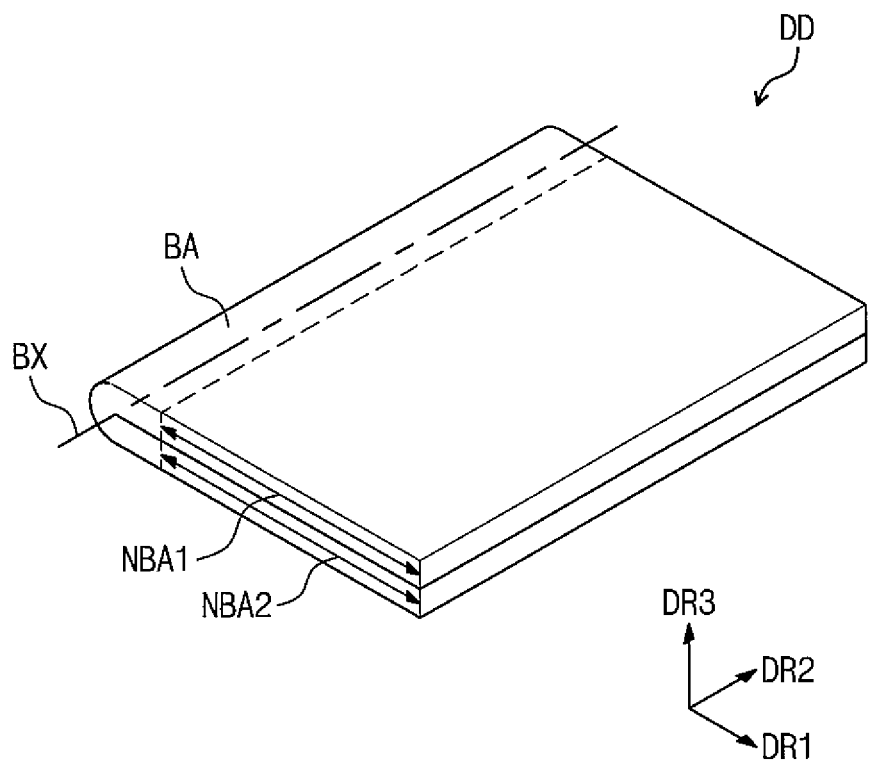
FIG. 1B is a perspective view showing a flexible display device in a second operation according to an exemplary embodiment of the present disclosure.
Figure 2A:
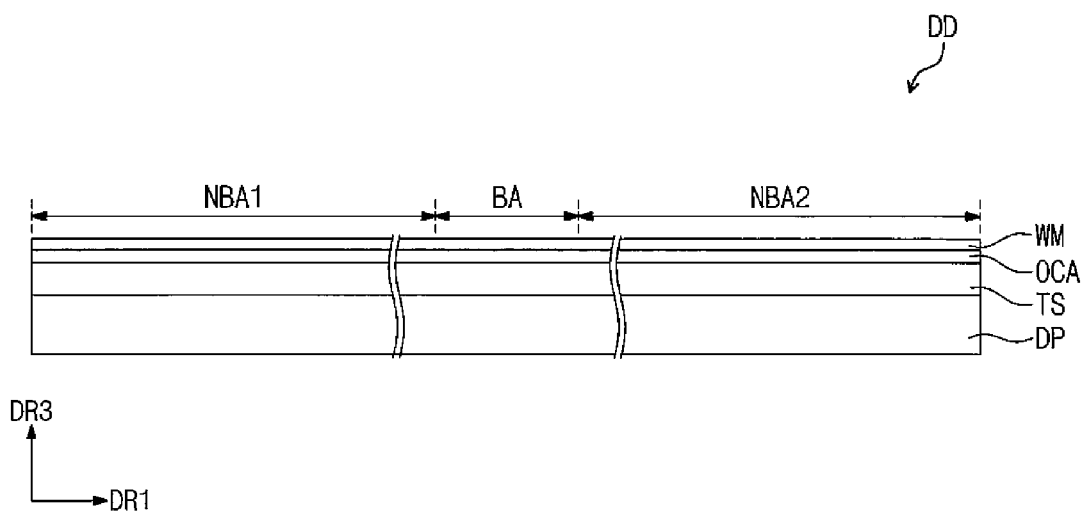
FIG. 2A is a cross-sectional view showing a flexible display device in a first operation according to an exemplary embodiment of the present disclosure.
Figure 2B:
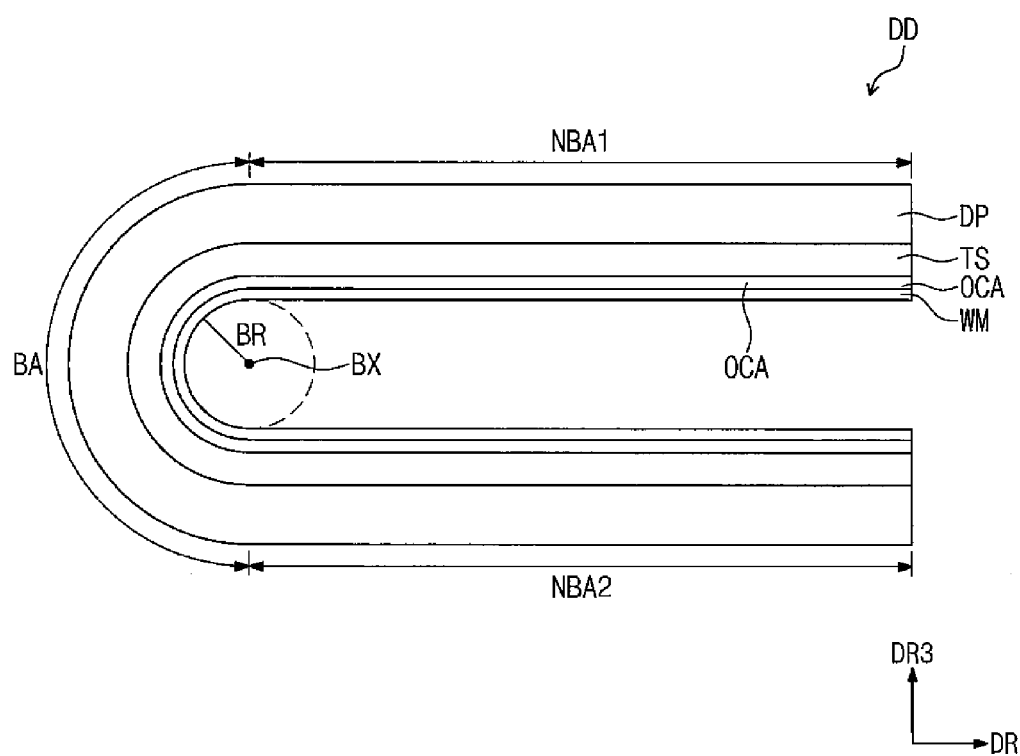
FIG. 2B is a cross-sectional view showing a flexible display device in a second operation according to an exemplary embodiment of the present disclosure.

FIG. 1A is a perspective view showing a flexible display device DD in a first operation according to an exemplary embodiment of the present disclosure. FIG. 1B is a perspective view showing the flexible display device DD in a second operation according to an exemplary embodiment of the present disclosure. FIG. 2A is a cross-sectional view showing the flexible display device DD in the first operation according to an exemplary embodiment of the present disclosure. FIG. 2B is a cross-sectional view showing the flexible display device DD in the second operation according to an exemplary embodiment of the present disclosure.

A display surface IS in which an image IM is displayed in a first operation state of the flexible display device DD is substantially parallel (or parallel) to a surface defined by a first direction axis DR1 and a second direction axis DR2. A normal line direction of the display surface IS, e.g., a thickness direction of the flexible display device DD, indicates a third direction DR3. In each member, a front surface is distinguished from a rear surface by the third direction axis DR3. However, the first to third direction axes DR1 to DR3 are relative to each other, and thus the first to third direction axes DR1 to DR3 may be changed to any other directions. For example, any of the first to third direction axes DR1 to DR3 may be rotated by 90 degrees. Hereinafter, first to third directions correspond to directions respectively indicated by the first to third direction axes DR1 to DR3, and thus the first to third directions are assigned with the same reference numerals as the first to third direction axes DR1 to DR3.

FIGS. 1A-2B show a foldable display device as a representative example of the flexible display device DD, but it should not be limited thereto or thereby. The flexible display device DD may be a curved flexible display device having a set (e.g., predetermined) curvature or a rollable flexible display device that is rollable. The flexible display device DD according to the present exemplary embodiment may be applied to a large-sized electronic item, such as, for example, a television set, a monitor, etc., and a small and medium-sized electronic item, such as, for example, a mobile phone, a tablet, a car navigation unit, a game unit, a smart watch, etc., but it should not be limited thereto or thereby.

Referring to FIG. 1A, the display surface IS of the flexible display device DD may include a plurality of areas. The flexible display device DD includes a display area DA in which the image IM is displayed and a non-display area NDA located adjacent to the display area DA. The non-display area NDA does not display the image IM. FIG. 1 shows an image of a vase as an example of the image IM. The display area DA has a substantially quadrangular shape and the non-display area NDA surrounds the display area DA, but they should not be limited thereto or thereby. For example, the shape of the display area DA and the shape of the non-display area NDA may be designed or set relative to each other.

Referring to FIGS. 1A-1B, the display device DD is divided into a plurality of areas in accordance with the operation state thereof. The display device DD includes a bending area BA surrounding a bending axis BX while being bent, a first non-bending area NBA1 (e.g., a first flat area) that is not bent, and a second non-bending area NBA2 (e.g., a second flat area) that is not bent. As shown in the figures, the display device DD may be inwardly bent such that the display surface IS of the first non-bending area NDA1 faces the display surface IS of the second non-bending area NDA2. The display device DD may be outwardly bent according to a user's operation.

The display device DD according to the present exemplary embodiment may include a plurality of bending areas BA. In addition, the bending area BA may be defined to correspond to the user's operation performed on the display device DD. For instance, different from FIG. 1B, the bending area BA may be defined to be substantially parallel (or parallel) to the first direction axis DR1 or may be defined in a diagonal (e.g., substantially diagonal) direction. The bending area BA has an area set (e.g., determined) depending on a bending radius BR (refer to FIG. 2A) while not being fixed.

Referring to FIGS. 2A-2B, the display device DD includes a display panel DP, a touch screen TS, and a window member WM. Each of the display panel DP, the touch screen TS, and the window member WM has a flexibility. The display device DD may further include a protective member coupled to the window member WM to protect the display panel DP and the touch screen TS. For example, the display device DD may further include an optical member, such as a polarizing plate, a retardation plate, etc. Further, the display device DD may further include an impact absorbing layer located between the members to absorb external impacts.

In the present exemplary embodiment, the display panel DP and the touch screen TS coupled to the display panel DP is referred to as a display module DM. The display panel DP and the touch screen TS are coupled to each other by an adhesive member or are integrally formed with each other through consecutive processes. In the present exemplary embodiment, the touch screen TS is manufactured together with the display panel through the consecutive processes. Accordingly, the adhesive member located between the touch screen TS and the display panel DP may be omitted.

The display panel DP generates the image IM (refer to FIG. 1A) corresponding to input image data. The display panel DP may be, but not limited to, an organic light emitting display panel, an electrophoretic display panel, or an electrowetting display panel. In the present exemplary embodiment, the organic light emitting display panel will be described as the display panel DP. Further detailed descriptions of the organic light emitting display panel will be provided herein.

The touch screen TS obtains coordinate information of an external input. The touch screen TS is disposed on a base substrate provided by the display panel DP. The touch screen TS may be an electrostatic capacitive type (e.g., capacitive kind) of touch screen, but it should not be limited thereto or thereby. For example, the touch screen TS may be replaced with another touch screen including two types (e.g., two kinds) of touch electrodes, e.g., electromagnetic induction type (e.g., electromagnetic induction kind) of touch panel.

The window member WM is coupled to the display module DM by an optically clear adhesive (OCA). The window member WM provides an input surface with which a stylus pen or a user's finger makes contact.

Figure 3A:
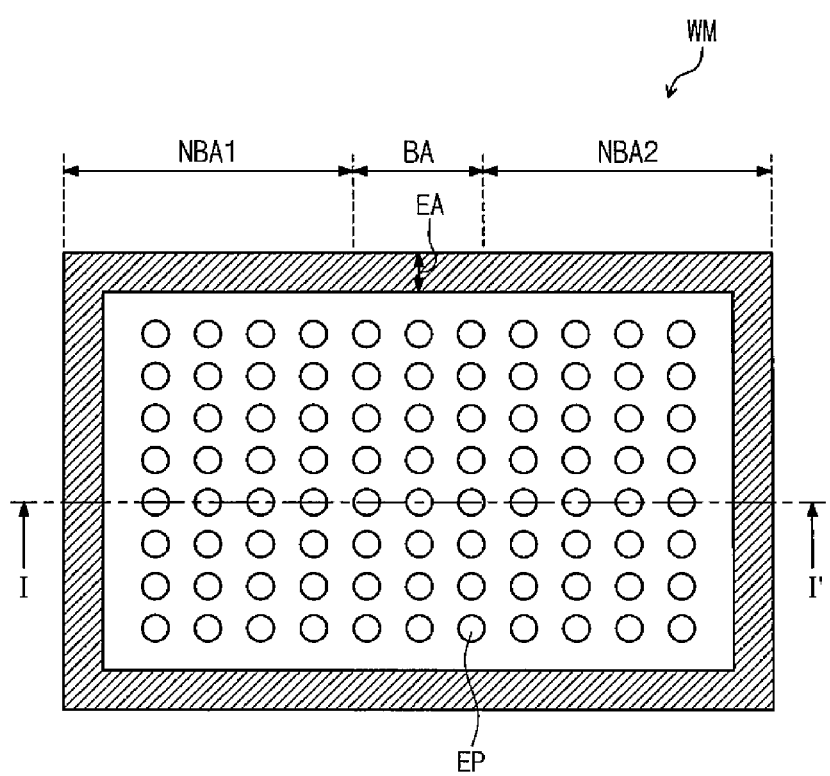
FIG. 3A is a plan view showing a window member according to an exemplary embodiment of the present disclosure.
Figure 3B:
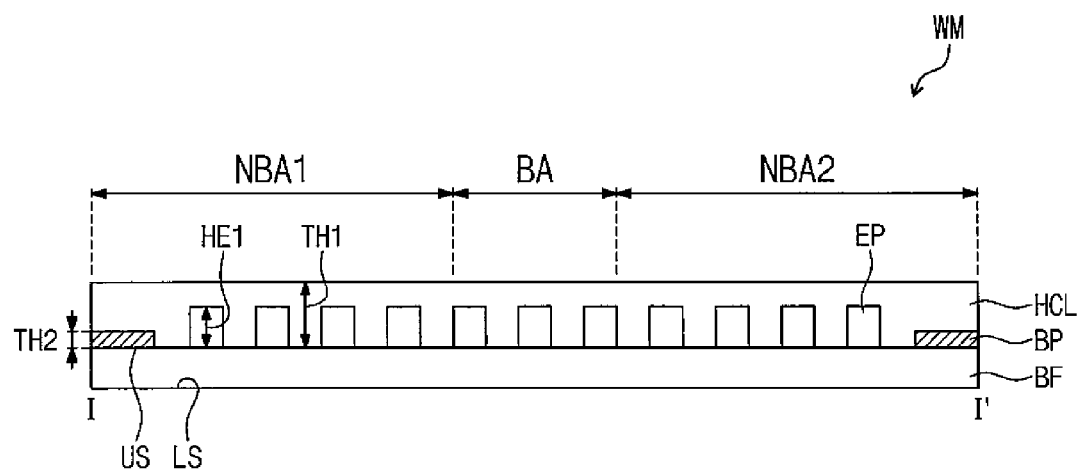
FIG. 3B is a cross-sectional view showing a window member according to an exemplary embodiment of the present disclosure.
Figure 3C:
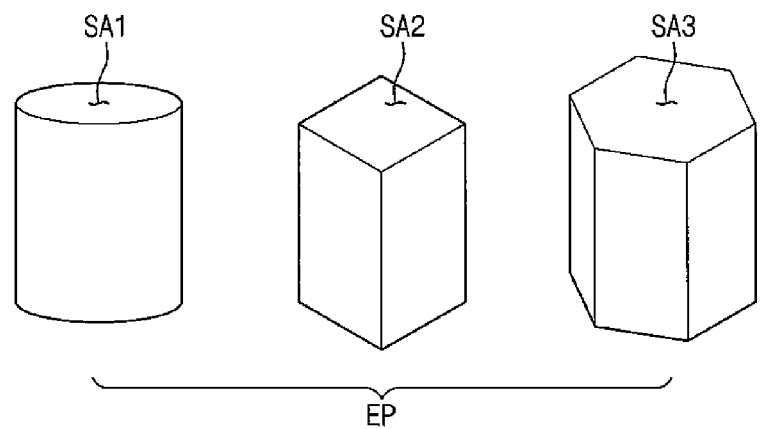
FIG. 3C is a perspective view showing elastomer patterns according to an exemplary embodiment of the present disclosure.
Figure 3D:
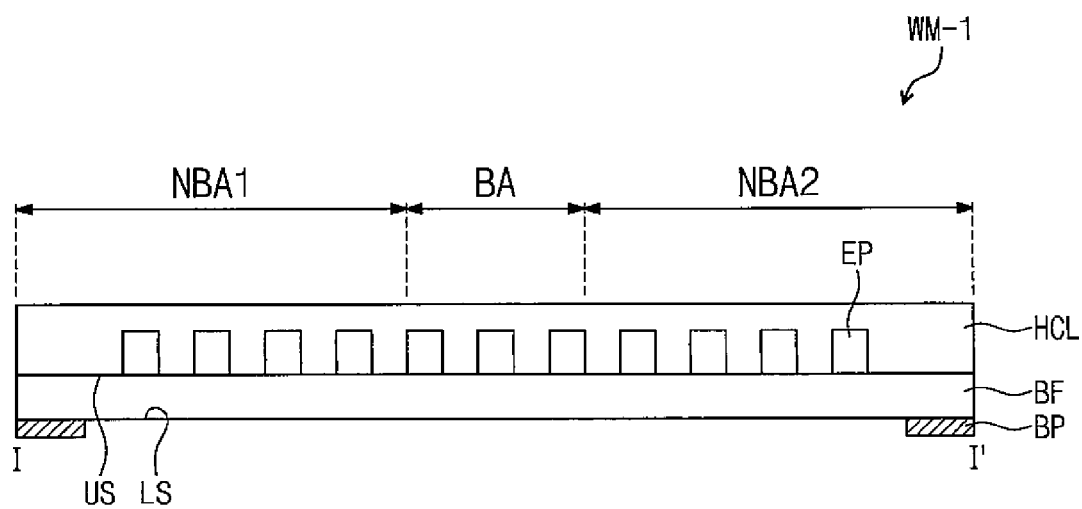
FIG. 3D is a cross-sectional view showing a window member according to an exemplary embodiment of the present disclosure.

FIG. 3A is a plan view showing a window member WM according to an exemplary embodiment of the present disclosure, FIG. 3B is a cross-sectional view showing the window member WM according to an exemplary embodiment of the present disclosure taken along a line I-I', FIG. 3C is a perspective view showing elastomer patterns EP according to an exemplary embodiment of the present disclosure, and FIG. 3D is a cross-sectional view showing a window member WM-1 according to an exemplary embodiment of the present disclosure taken along a line I-I'.

The window member WM includes a base film BF, the elastomer patterns EP disposed on the base film BF, and a hard coating layer HCL disposed on the base film BF. The window member WM includes a plurality of areas respectively corresponding to the bending area BA, the first non-bending area NBA1, and the second non-bending area NBA2 of the display device DD. The window member WM may further include a functional layer, e.g., an anti-fingerprint layer, an anti-reflective layer, and/or the like.

The base film BF includes a flexible plastic film. The elastomer patterns EP and the hard coating layer HCL are disposed on one surface US of the base film BF, and the other surface LS of the base film BF is attached to the optically clear adhesive (OCA).

The elastomer patterns EP improve the flexibility of the window member WM. In addition, the elastomer patterns EP absorb external impacts to prevent the window member WM from being cracked (or an amount or likelihood of such cracking may be reduced). As shown in FIGS. 3A-3B, the elastomer patterns EP are uniformly (e.g., substantially uniformly) arranged in the bending area BA, the first non-bending area NBA1, and the second non-bending area NBA2. The elastomer patterns EP are spaced apart from each other at regular (e.g., substantially regular) intervals. The number of the elastomer patterns EP in a unit area is approximately constant regardless of the bending area BA, the first non-bending area NBA1, and the second non-bending area NBA2.

However, the elastomer patterns EP are sufficient to be arranged in the bending area BA. The elastomer patterns EP arranged in the bending area BA reduce the modulus of the bending area BA.

In some embodiments, the elastomer patterns EP are more densely arranged in the bending area BA than that in the first and second non-bending areas NBA1 and NBA2.

Each of the elastomer patterns EP includes polyisoprene rubber, polybutadiene rubber, chloroprene rubber, butyl rubber, halogenated butyl rubber, styrene-butadiene rubber, nitrile rubber, halogenated nitrile rubber, ethylene propylene rubber, ethylene propylene diene rubber, epichlorohydrin robber, polyacrylic rubber, silicone rubber, fluorosilicone rubber, fluoroelastomer, perfluoroelastomer, polyether block amides, chlorosulfonated polyethylene, and/or ethylene vinyl acetate.

However, the elastomer patterns EP should not be limited to the above-mentioned materials. The elastomer patterns EP have a pencil hardness of about 4B to about 5B and have an elastic modulus in a range from a few MPa to hundreds of MPa. In some embodiments, the elastic modulus of the elastomer patterns EP is in a range from about 50 MPa to about 100 MPa.

In the present exemplary embodiment, the elastomer patterns EP have the same (e.g., substantially the same) shape as each other and include the same (e.g., substantially the same) material. In the embodiments shown in FIG. 3C, each elastomer pattern EP has a cylindrical shape or a polygonal cylindrical shape, such as, for example, a rectangular cylindrical shape or a hexagonal cylindrical shape, but the shape of the elastomer patterns EP should not be limited thereto or thereby.

Each elastomer pattern EP has a height HE1 of about 20 micrometers to about 40 micrometers. As the height HE1 of the elastomer patterns EP increases, the flexibility of the window member WM increases.

The elastomer patterns EP are overlapped with about 20% to about 50% of an entire area of the base film BF on the one surface of the base film BF. When the elastomer patterns EP have an area smaller than 20% of the entire area of the base film BF, the flexibility of the window member WM is reduced below a reference value. When the elastomer patterns EP have an area greater than 50% of the entire area of the base film BF, the hardness of the window member WM is reduced below a reference value. Each elastomer pattern EP has the area in the range from about 10 $\mu m^2$ to about 100

μm². The area corresponds to the area of upper surfaces SA1 to SA3 of the elastomer patterns EP having the cylindrical shape, the rectangular cylindrical shape, and the hexagonal cylindrical shape.

The hard coating layer HCL is disposed on the one surface US of the base film BF and covers (e.g., substantially covers) the elastomer patterns EP. The hard coating layer HCL improves a surface hardness of the window member WM.

In the present exemplary embodiment, the hard coating layer HCL may include a silicon-based polymer. The hard coating layer HCL should not be limited to a specific material. The hard coating layer HCL may further include an anti-fingerprint material and an anti-reflective material.

The hard coating layer HCL has a pencil hardness of about 7H to about 9H and an elastic modulus of about 5 GPa to about 7 GPa.

The hard coating layer HCL has a thickness TH1 greater than the height HE1 of each of the elastomer patterns EP. The thickness TH1 of the hard coating layer HCL is in a range from about 30 micrometers to about 50 micrometers. The hard coating layer HCL covers (e.g., substantially covers) the elastomer patterns EP to provide a plane surface. Therefore, the input surface of the window member WM is provided by the hard coating layer HCL.

To prevent the elastomer patterns EP from being perceived (or to reduce the visibility of the elastomer patterns EP), the hard coating layer HCL and the elastomer patterns EP have the same (e.g., substantially the same) refractive index. The refractive index of the hard coating layer HCL may be controlled by adjusting a composition ratio of the additive, e.g., a leveling agent.

The window member WM according to the present exemplary embodiment may further include a bezel pattern BP disposed on the upper surface US of the base film BF. As shown in FIG. 3D, the bezel pattern BP of the window member WM-1 may be disposed on the lower surface LS of the base film BF. The bezel pattern BP is overlapped with an edge area EA (e.g., a periphery) of the base film BF. The edge area EA is defined along an edge (e.g., a periphery) of the base film BF and corresponds to the non-display area NDA of the display device DD (shown in FIG. 3A).

The bezel pattern BP may be a colored organic layer, and thus, may include an organic dye and an organic pigment. The bezel pattern BP may have a multi-layer structure. The bezel pattern BP may include a light blocking layer, a color layer, and a pattern providing layer having a set (e.g., specific) pattern, such as, for example, a hair line pattern.

The bezel pattern BP is covered (e.g., substantially covered) by the hard coating layer HCL. The bezel pattern BP has a thickness TH2 of about 3 micrometers to about 6 micrometers.

The display device including the window member WM shown in FIG. 3B may have a thickness smaller than that of the display device including the window member WM-1 shown in FIG. 3D. This is because, when the optically clear adhesive OCA is disposed on the lower surface LS of the base film BF, the step difference compensation function of the optically clear adhesive OCA is not necessary and the thickness of the optically clear adhesive OCA may be reduced.

Figure 4:
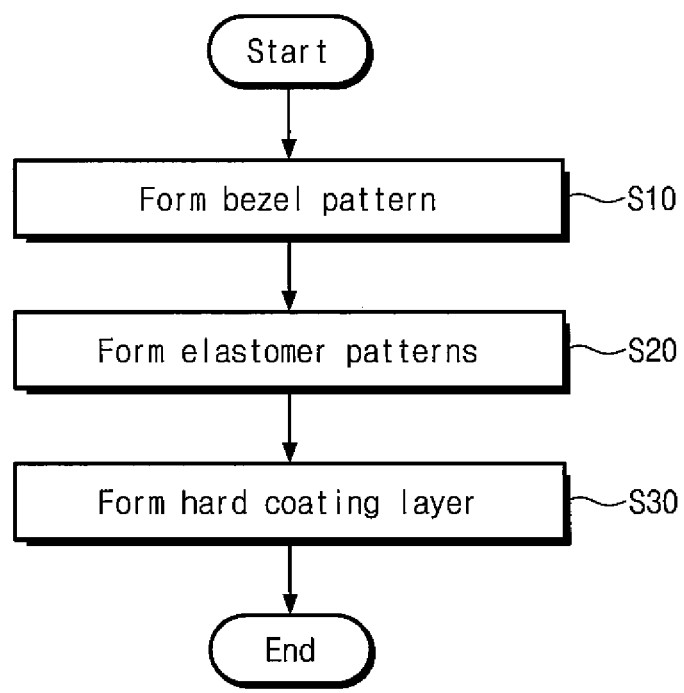
FIG. 4 is a flowchart showing a manufacturing process of a window member according to an exemplary embodiment of the present disclosure.

FIG. 4 is a flowchart showing a manufacturing process of a window member according to an exemplary embodiment of the present disclosure.

The bezel pattern BP is formed on the upper surface US or the lower surface LS of the base film BF (S10). The bezel pattern BP is formed in the edge area along the edge (e.g., the periphery) of the base film BF. The bezel pattern BP may be formed by printing method, such as, for example, a gravure printing method, a silk-screen printing method, etc.

Then, the elastomer patterns EP are formed on the upper surface US of the base film BF (S20). The elastomer patterns EP may be formed by a printing method, such as, for example, a gravure printing method, a silk-screen printing method, etc.

The hard coating layer HCL is formed on the upper surface US of the base film BF (S30). The hard coating layer HCL may be formed by printing method, such as, for example, a gravure printing method, a silk-screen printing method, etc., or a coating method, e.g., a spin-coating method, a slit-coating method, a bar-coating method, etc.

In more detail, a hard coating composition is coated on the upper surface US of the base film BF. The hard coating composition includes a solvent, an oligomer, a crosslinker, and a photoinitiator. The solvent may be, but not limited to, a ketone-based organic solvent. The hard coating composition includes about 10 to about 50 parts by weight of the solvent with respect to 100 parts by weight of the hard coating composition, about 5 to about 70 parts by weight of the oligomer with respect to 100 parts by weight of the hard coating composition, about 10 to 80 parts by weight of the crosslinker with respect to 100 parts by weight of the hard coating composition, and about 1 to 5 parts by weight of the photoinitiator with respect to 100 parts by weight of the hard coating composition.

The oligomer may include a silicon-based oligomer represented by the following chemical formula 1, which is prepared by a sol-gel process from siloxane monomer. In chemical formula 1, "n" is 10 to 75.

Chemical formula 1

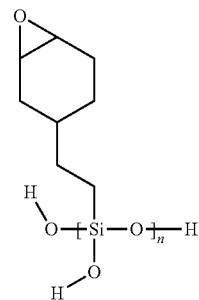

The crosslinker may be an epoxy-based monomer represented by the following chemical formula 2.

Chemical formula 2

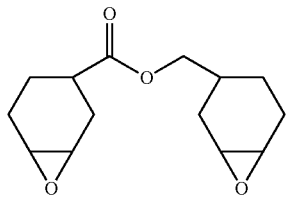

The photoinitiator may be an iodine-based compound represented by the following chemical formula 3. In chemical formula 3, "R" indicates an electron-withdrawing group, but it should not be limited thereto or thereby.

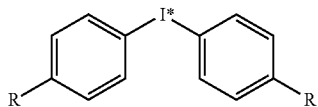

Chemical formula 3

The hard coating composition coated on the upper surface US of the base film BF forms the hard coating layer including polymer represented by the following chemical formula 4 through a drying process, a light-curing process, and a heat-curing process. In chemical formula 4, "m" is 1 to 20.

Chemical formula 4

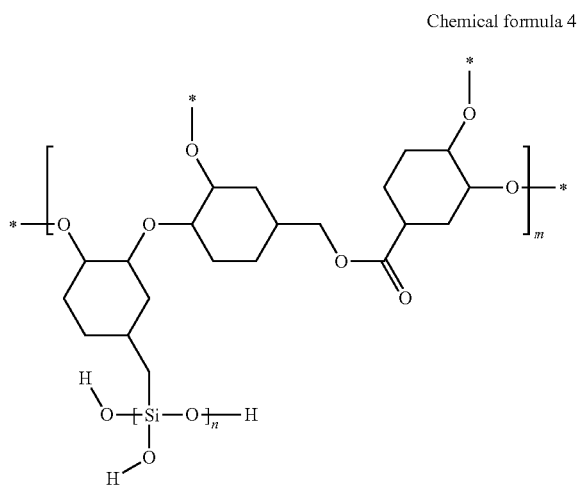

Figure 5A:
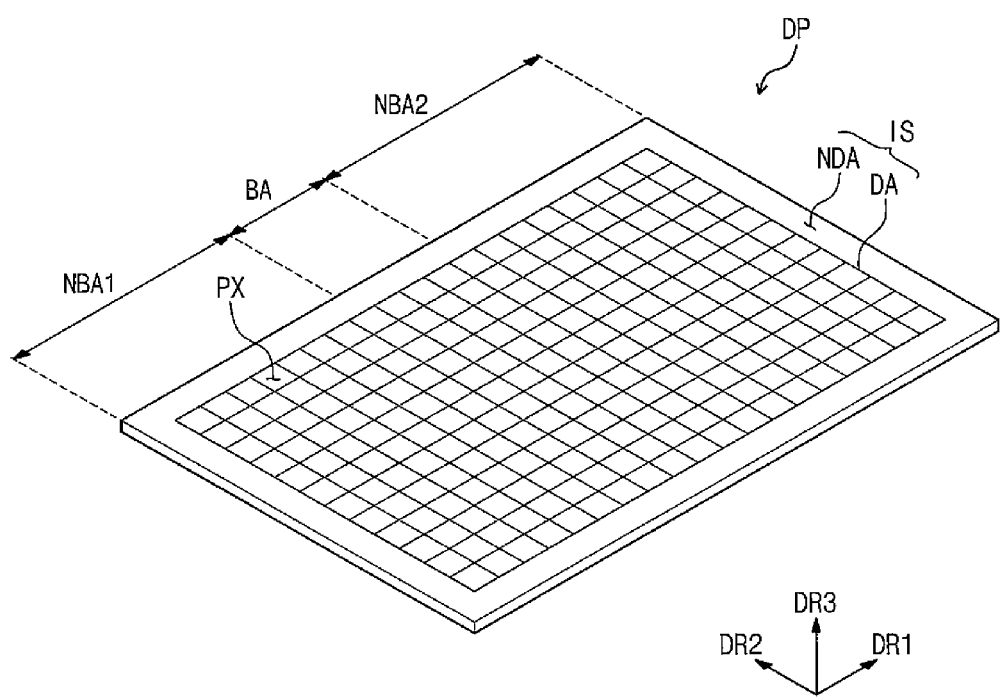
FIG. 5A is a perspective view showing a display panel according to an exemplary embodiment of the present disclosure.
Figure 5B:
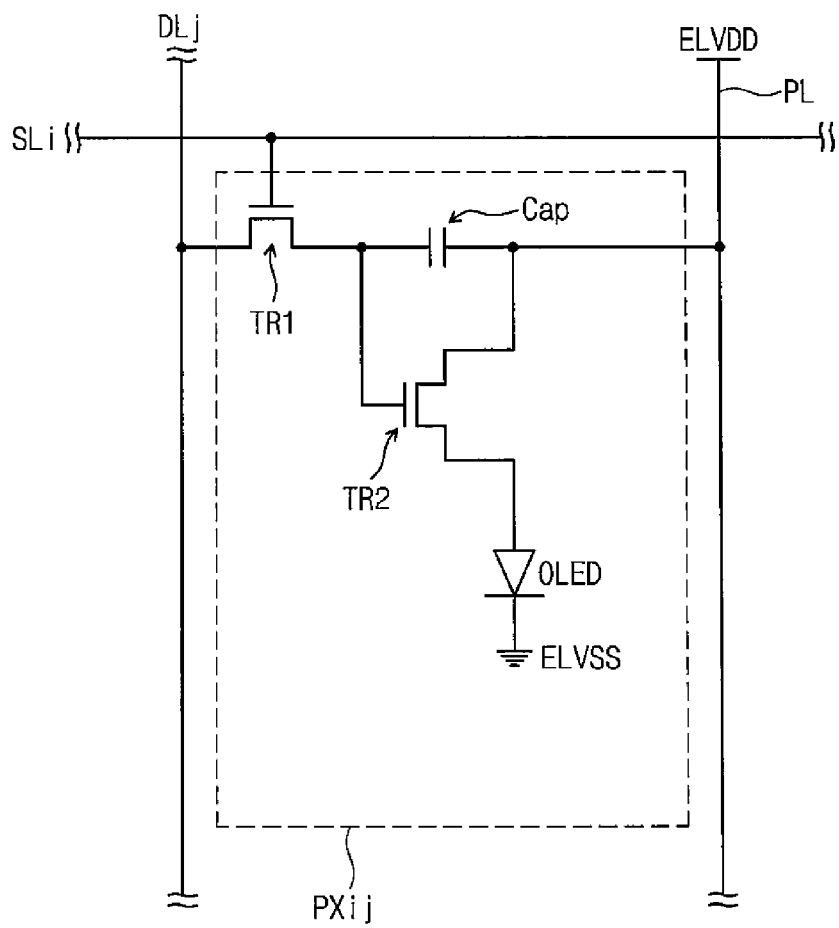
FIG. 5B is an equivalent circuit diagram showing a pixel according to an exemplary embodiment of the present disclosure.
Figure 5C:
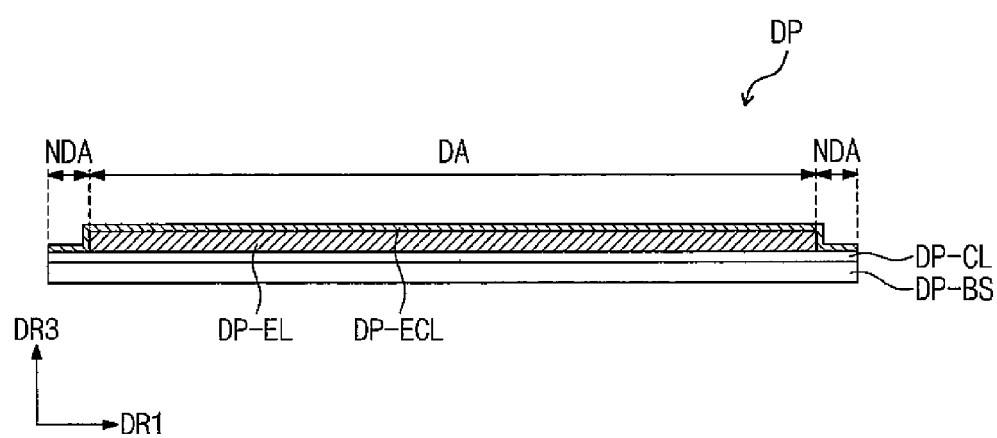
FIG. 5C is a cross-sectional view showing a display panel according to an exemplary embodiment of the present disclosure.

FIG. 5A is a perspective view showing a display panel DP according to an exemplary embodiment of the present disclosure, FIG. 5B is an equivalent circuit diagram showing a pixel PXij according to an exemplary embodiment of the present disclosure, and FIG. 5C is a cross-sectional view showing the display panel DP according to an exemplary embodiment of the present disclosure. Hereinafter, the organic light emitting display panel DP will be described as the flexible display panel DP.

Referring to FIG. 5A, the organic light emitting display panel DP includes a display area DA and a non-display area NDA when viewed in a plan view. The organic light emitting display panel DP includes a plurality of pixels PX arranged in the display area DA. In the present exemplary embodiment, the pixels PX are arranged in a matrix form, but they should not be limited thereto or thereby. For example, the pixels PX may be arranged in a pentile form.

FIG. 5B shows the equivalent circuit diagram of one pixel PXij coupled to (e.g., connected to) an i-th scan line SLi and a j-th source line DLj. The pixels PX (refer to FIG. 5A) may have the same (e.g., substantially the same) equivalent circuit diagram.

The pixel PXij includes at least one selected from transistor TR1 and TR2, at least one capacitor Cap, and an organic light emitting element OLED. In the present exemplary embodiment, a pixel driving circuit including two transistors TR1 and TR2 and one capacitor Cap is shown in FIG. 5B, but the pixel driving circuit should not be limited thereto or thereby.

An anode of the organic light emitting element OLED receives a first power source voltage ELVDD applied to a power source line PL through a second transistor TR2. A cathode of the organic light emitting element OLED receives a second power source voltage ELVSS. A first transistor TR1 outputs a data signal applied to the j-th source line DLj in response to a scan signal applied to the i-th scan line SLi. The capacitor Cap is charged with a voltage corresponding to the data signal provided from the first transistor TR1. The second transistor TR2 controls a driving current flowing through the organic light emitting element OLED in response to the voltage charged in the capacitor Cap.

As shown in FIG. 5C, the organic light emitting display panel DP includes a base member DP-BS, a circuit layer DP-CL, an element layer DP-EL, and an encapsulation layer DP-ECL. The organic light emitting display panel DP may further include an optical member disposed on the encapsulation layer DP-ECL, e.g., a retardation plate, a polarizing plate, etc.

The base member DP-BS includes at least one selected from a plastic substrate, a glass substrate, and a metal substrate. In the present exemplary embodiment, the base member DP-BS may include two plastic films, e.g., a silicon nitride layer and/or a silicon oxide layer, and inorganic layers located between the two plastic films. The base member DP-BS includes at least one selected from polyimide (PI), polyethyleneterephthalate (PET), polyethylenenaphthalate (PEN), polyethersulphone (PES), and fiber reinforced plastics (FRP).

The circuit layer DP-CL includes a plurality of signal lines, electronic elements, and a plurality of insulating layers insulating the signal lines from the electronic elements. The insulating layers include organic layers and inorganic layers. The circuit layer DP-CL may include the i-th scan line SLi, the j-th source line DLj, the power source line PL, the first and second transistors TR1 and TR2, and the capacitor Cap.

The element layer DP-EL includes the organic light emitting element OLED. The element layer DP-EL may further include electronic elements to assist the organic light emitting element OLED.

The encapsulation layer DP-ECL encapsulates the element layer DP-EL. The element layer DP-EL includes a thin film encapsulation layer (TFE) including a plurality of inorganic thin film layers and a plurality of organic thin film layers. The encapsulation layer DP-ECL is disposed to overlap with the display area DA and the non-display area NDA.

Pads coupled to (e.g., connected to) ends of the signal lines and other driving circuits are arranged to be concentrated in the non-display area NDA of the display panel DP. The bezel pattern BP (refer to FIG. 3B) is disposed to overlap with the non-display area NDA of the organic light emitting display panel DP to prevent the non-display area NDA of the organic light emitting display panel DP from being perceived by the user (or to reduce the visibility of the non-display area NDA). However, the shape of the bezel pattern BP is not needed to be the same as the non-display area NDA of the display device DD and may be changed depending on the structure and design of the organic light emitting display panel DP.

Figure 6A:
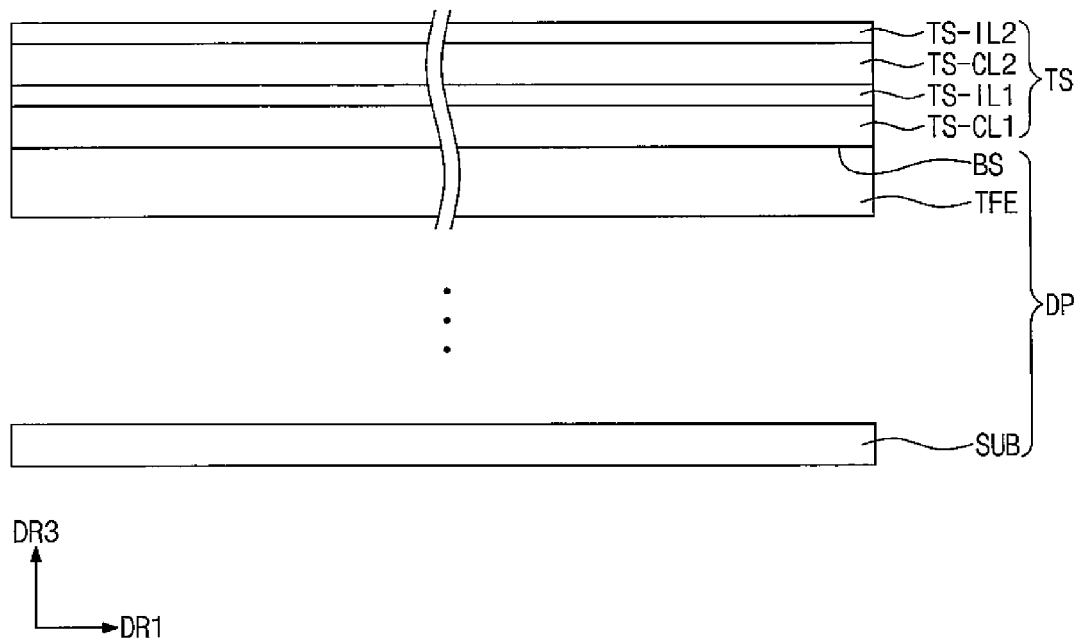
FIG. 6A is a cross-sectional view showing a touch screen according to an exemplary embodiment of the present disclosure.
Figure 6B:
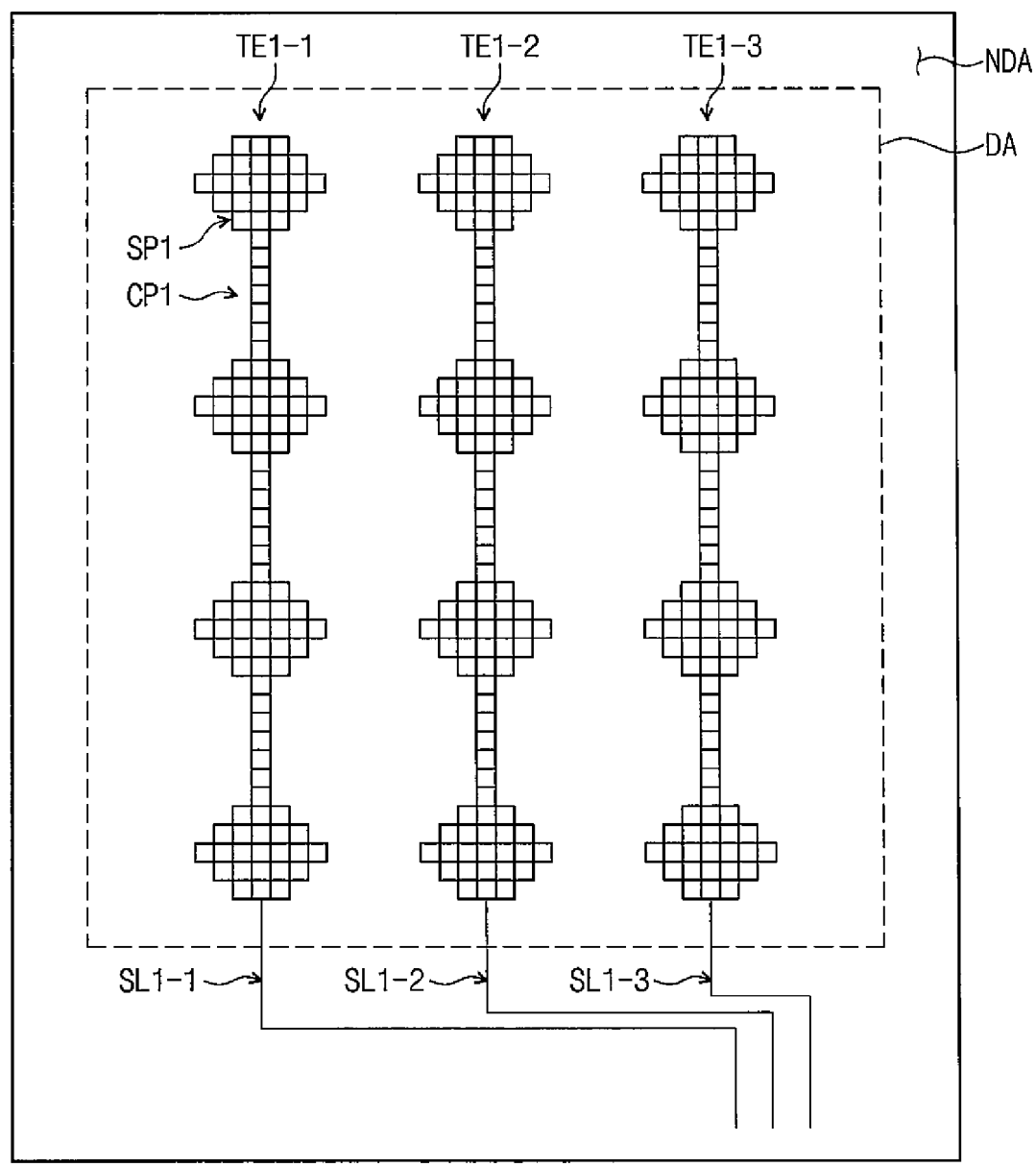
FIGS. 6B-6C are plan views showing conductive layers of a touch screen according to an exemplary embodiment of the present disclosure.
Figure 6C:
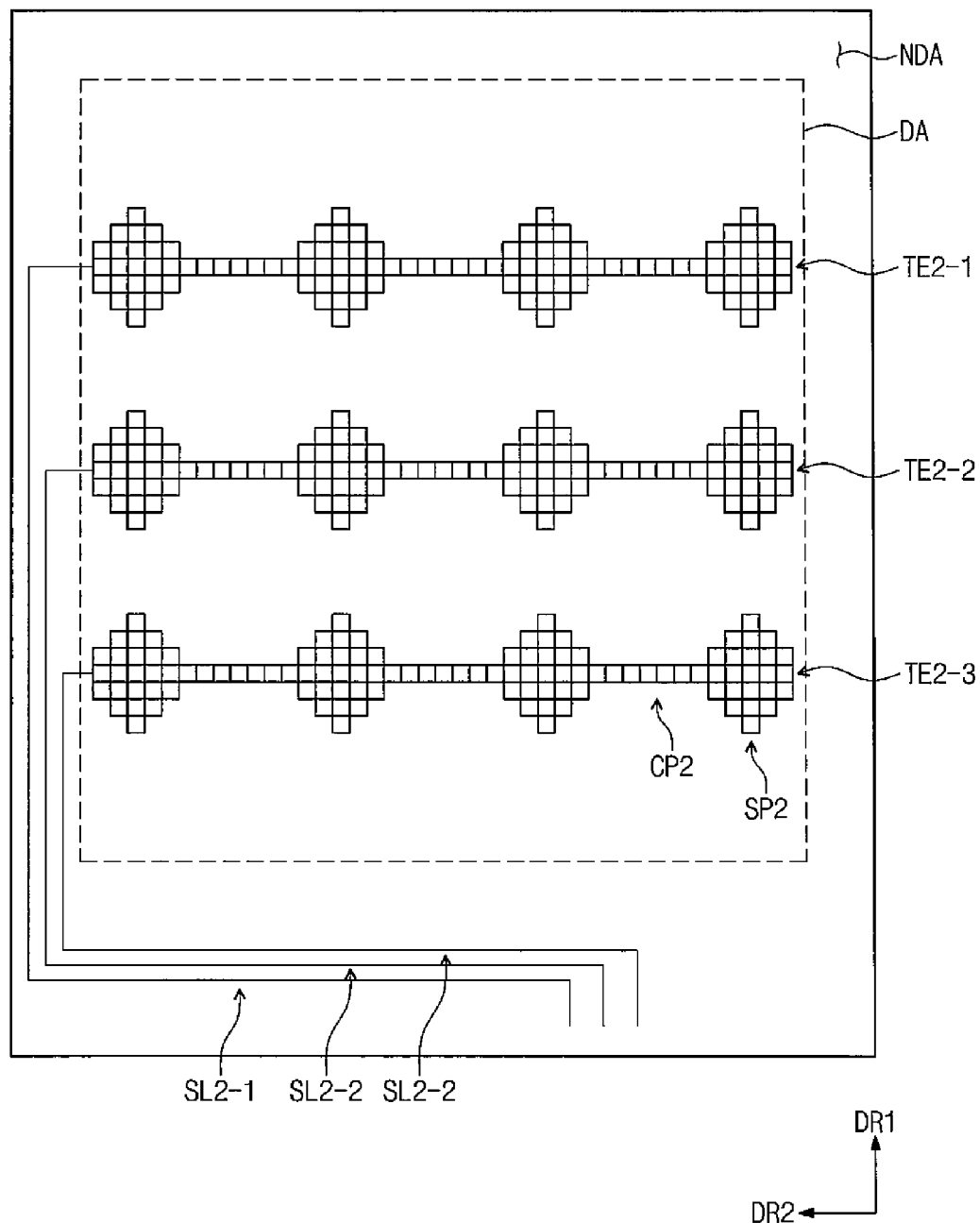

FIG. 6A is a cross-sectional view showing a touch screen TS according to an exemplary embodiment of the present disclosure and FIGS. 6B-6C are plan views showing conductive layers of the touch screen TS according to an exemplary embodiment of the present disclosure. Referring to FIG. 6A, the touch screen TS includes a first conductive layer TS-CL1, a first insulating layer TS-IL1, a second conductive layer TS-CL2, and a second insulating layer TS-IL2.

Each of the first and second conductive layers TS-CL1 and TS-CL2 may have a single-layer structure or a multi-layer structure in the third direction DR3. The conductive layer having the multi-layer structure includes a transparent conductive layer and at least one metal layer. The transparent conductive layer includes indium tin oxide (ITO), indium zinc oxide (IZO), zinc oxide (ZnO), indium tin zinc oxide (ITZO), PEDOT, a metal nano-wire, and/or a graphene. The metal layer includes molybdenum, silver, titanium, copper, aluminum, and/or an alloy thereof.

Each of the first and second conductive layers TS-CL1 and TS-CL2 includes a plurality of patterns. The first conductive layer TS-CL1 includes first conductive patterns and the second conductive layer TS-CL2 includes second conductive patterns. The first and second conductive patterns include touch electrodes and touch signal lines.

Each of the first and second insulating layers TS-IL1 and TS-IL2 includes an inorganic material and/or an organic material. The inorganic material includes silicon oxide and/or silicon nitride. The organic material includes at least one selected from an acrylic-based resin, a methacryl-based resin, polyisoprene, a vinyl-based resin, an epoxy-based resin, a urethane-based resin, a cellulose-based resin, and a perylene-based resin.

As shown in FIG. 6A, the first conductive layer TS-CL1 may be disposed on the thin film encapsulation layer TFE included in a display panel DP, which further includes a substrate SUB. In other words, the thin film encapsulation layer TFE provides the base surface BS on which the touch screen TS is disposed. A buffer layer providing the base surface may be further disposed on the thin film encapsulation layer TFE.

In the present exemplary embodiment, a two-layer capacitance touch screen is shown as a representative example. The two-layer capacitance touch screen obtains the coordinate information of a position at which a touch event occurs by using a self-capacitance manner or a mutual capacitance manner. Embodiments of the driving method of the touch screen to obtain the coordinate information should not be limited to a specific method.

Referring to FIG. 6B, the first conductive patterns include first touch electrodes TE1-1 to TE1-3 and first touch signal lines SL1-1 to SL1-3. FIG. 6B shows three first touch electrodes TE1-1 to TE1-3 and the first touch signal lines SL1-1 to SL1-3 coupled to (e.g., connected to) the first touch electrodes TE1-1 to TE1-3.

The first touch electrodes TE1-1 to TE1-3 extend in the first direction DR1 and are arranged in the second direction DR2. Each of the first touch electrodes TE1-1 to TE1-3 may have a mesh shape through which a plurality of touch openings are defined.

Each of the first touch electrodes TE1-1 to TE1-3 includes a plurality of first sensor parts SP1 and a plurality of first connection parts CP1. The first sensor parts SP1 are arranged in the first direction DR1. Each of the first connection parts CP1 couples (e.g., connects) two first sensor parts adjacent to each other among the first sensor parts SP1.

The first touch signal lines SL1-1 to SL1-3 may have a mesh shape. The first touch lines SL1-1 to SL1-3 may have the same (e.g., substantially the same) layer structure as the first touch electrodes TE1-1 to TE1-3.

Referring to FIG. 6C, the second conductive patterns include second touch electrodes TE2-1 to TE2-3 and second touch signal lines SL2-1 to SL2-3. FIG. 6C shows three second touch electrodes TE2-1 to TE2-3 and second touch signal lines SL2-1 to SL2-3 coupled to (e.g., connected to) the second touch electrodes TE2-1 to TE2-3.

The second touch electrodes TE2-1 to TE2-3 are insulated from the first touch electrodes TE1-1 to TE1-3 while crossing the first touch electrodes TE1-1 to TE1-3. Each of the second touch electrodes TE2-1 to TE2-3 may have a mesh shape through which a plurality of touch openings are defined. Each of the second touch electrodes TE2-1 to TE2-3 includes a plurality of second sensor parts SP2 and a plurality of second connection parts CP2. The second sensor parts SP2 are arranged in the second direction DR2. Each of the second connection parts CP2 couples (e.g., connects) two second sensor parts adjacent to each other among the second sensor parts SP2.

The second sensor parts SP2 may be included in the first conductive layer TS-CL1. The second connection parts CP2 have a bridge function. Accordingly, one-layer capacitance touch screen may be realized.

The second touch signal lines SL2-1 to SL2-3 may have the mesh shape. The second touch signal lines SL2-1 to SL2-3 may have the same (e.g., substantially the same) layer structure as the second touch electrodes TE2-1 to TE2-3.

The first touch electrodes TE1-1 to TE1-3 are capacitively coupled to the second touch electrodes TE2-1 to TE2-3. When touch sensing signals are applied to the first touch electrodes TE1-1 to TE1-3, capacitors are formed between the first sensor parts SP1 and the second sensor parts SP2.

In the present exemplary embodiment, the shapes of the first and second touch electrodes TE1-1 to TE1-3 and TE2-1 to TE2-3, which include the sensor parts and the connection parts, should not be limited to those shown or described. It is sufficient that the connection parts correspond to portions at which the first touch electrodes TE1-1 to TE1-3 cross the second touch electrodes TE2-1 to TE2-3, and it is sufficient that the sensor parts correspond to portions at which the first touch electrodes TE1-1 to TE1-3 are not overlapped with the second touch electrode TE2-1 to TE2-3. For instance, each of the first touch electrodes TE1-1 to TE1-3 and the second touch electrode TE2-1 to TE2-3 may have a bar shape with a set (e.g., predetermined) width.

As shown in FIGS. 6A-6C, the touch screen TS includes the display area DA and the non-display area NDA distinct from the display area DA when viewed in a plan view. The first touch signal lines SL1-1 to SL1-3, the second touch signal lines SL2-1 to SL2-3, and the pads coupled to (e.g., connected to) the ends of the signal lines are concentrated arranged in the non-display area NDA of the touch screen TS. The bezel pattern BP (refer to FIG. 3B) is disposed to overlap with the non-display area NDA of the touch screen TS to prevent the non-display area NDA of the touch screen TS from being perceived by the user (or to reduce the visibility of the non-display area NDA). However, the shape of the bezel pattern BP is not needed to be the same as the non-display area NDA of the touch screen TS and may be changed depending on the structure and design of the touch screen TS.

Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described herein could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, acts, operations, elements, and/or components, but do not preclude the presence or addition of one or more other features, integers, acts, operations, elements, components, and/or groups thereof.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although exemplary embodiments of the present disclosure have been described, it is understood that the present disclosure should not be limited to these exemplary embodiments but, on the contrary, the present disclosure is intended to cover various changes, modifications, and equivalent arrangements included within the spirit and scope of the appended claims, and equivalents thereof.

What is claimed is:

1. A flexible display device comprising:
    a display module; and
    a window member on the display module, the window member comprising:
        a base film;
        elastomer patterns on a surface of the base film; and
        a hard coating layer on the surface of the base film to cover the elastomer patterns,
    wherein the elastomer patterns are overlapped with about 20% to about 50% of an entire area of the surface of the base film.

2. The flexible display device of claim 1, wherein each of the elastomer patterns comprises at least polyisoprene rubber, polybutadiene rubber, chloroprene rubber, butyl rubber, halogenated butyl rubber, styrene-butadiene rubber, nitrile rubber, halogenated nitrile rubber, ethylene propylene rubber, ethylene propylene diene rubber, epichlorohydrin rubber, polyacrylic rubber, silicone rubber, fluorosilicone rubber, fluoroelastomer, perfluoroelastomer, polyether block amides, chlorosulfonated polyethylene, or ethylene vinyl acetate.

3. The flexible display device of claim 2, wherein the elastomer patterns each have a same shape and comprise a same material.

4. The flexible display device of claim 1, wherein the elastomer patterns are spaced apart from each other at regular intervals.

5. The flexible display device of claim 4, wherein each of the elastomer patterns has a height of about 20 micrometers to about 40 micrometers.

6. The flexible display device of claim 5, wherein the hard coating layer has a thickness greater than the height of each of the elastomer patterns and the thickness of the hard coating layer is in a range from about 30 micrometers to about 50 micrometers.

7. The flexible display device of claim 1, wherein each of the elastomer patterns has an area of about 10 $\mu m^2$ to about 100 $\mu m^2$ on the one surface of the base film.

8. The flexible display device of claim 1, wherein the display module comprises a display area to display an image and a non-display area adjacent to the display area, and the window member further comprises a bezel pattern overlapped with an edge area of the base film corresponding to the non-display area.

9. The flexible display device of claim 8, wherein the bezel pattern is on the surface of the base film and the hard coating layer covers the bezel pattern.

10. The flexible display device of claim 1, wherein the display module comprises:
    a display panel configured to generate an image; and
    a touch screen on the display panel to sense an external input.

11. The flexible display device of claim 10, wherein the display panel comprises:
    a base substrate;
    a circuit layer on the base substrate;
    an organic light emitting element layer on the circuit layer; and
    a thin film encapsulation layer configured to encapsulate the organic light emitting element layer.

12. The flexible display device of claim 11, wherein the touch screen comprises first and second touch electrodes insulated from each other and crossing each other, and at least one selected from the first and second touch electrodes is directly on the thin film encapsulating layer.

13. A flexible display device comprising:
a display module; and
a window member on the display module, the window member comprising:
a base film;
elastomer patterns on a surface of the base film; and
a hard coating layer on the surface of the base film to cover the elastomer patterns,
wherein each of the elastomer patterns has a pencil hardness of about 4B to about 5B and the hard coating layer has a pencil hardness of about 7H to about 9H.

14. The flexible display device of claim 13, wherein each of the elastomer patterns has an elastic modulus of about 50 MPa to about 100 MPa and the hard coating layer has an elastic modulus of about 5 GPa to about 7 GPa.

15. A flexible display device comprising a bending area and a flat area, comprising:
a display module; and
a window member on the display module, the window member comprising:
a base film:
elastomer patterns at least in the bending area and on a surface of the base film; and
a hard coating layer configured to cover the elastomer patterns,
wherein the elastomer patterns are overlapped with about 20% to about 50% of an entire area of the bending area.

16. The flexible display device of claim 15, wherein the window member further comprises a bezel pattern overlapped with an edge area of the base film and on the surface of the base film.

17. The flexible display device of claim 15, wherein each of the elastomer patterns has an area of about 10 $\mu m^2$ to about 100 $\mu m^2$ on the one surface of the base film.

18. The flexible display device of claim 15, wherein each of the elastomer patterns comprises at least polyisoprene rubber, polybutadiene rubber, chloroprene rubber, butyl rubber, halogenated butyl rubber, styrene-butadiene rubber, nitrile rubber, halogenated nitrile rubber, ethylene propylene rubber, ethylene propylene diene rubber, epichlorohydrin rubber, polyacrylic rubber, silicone rubber, fluorosilicone rubber, fluoroelastomer, perfluoroelastomer, polyether block amides, chiorosulfonated polyethylene, or ethylene vinyl acetate.

19. A flexible display device comprising:
a display module; and
a window member on the display module, the window member comprising:
a base film;
elastomer patterns on a surface of the base film; and
a hard coating layer on the surface of the base film to cover the elastomer patterns,
wherein the hard coating layer contacts with side surfaces of the elastomer patterns.

20. The flexible display device of claim 19, wherein the hard coating layer comprises a silicone-based polymer.

* * * * *